US012360363B2

United States Patent
Druml et al.

(10) Patent No.: US 12,360,363 B2
(45) Date of Patent: *Jul. 15, 2025

(54) FAST LISSAJOUS LOCK CONTROL AND SYNCHRONIZATION OF SCANNING AXES OF MICROELECTROMECHANICAL SYSTEMS

(71) Applicant: Infineon Technologies AG, Neubiberg (DE)

(72) Inventors: Norbert Druml, Graz (AT); Alberto Garcia Izquierdo, Graz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/598,242

(22) Filed: Mar. 7, 2024

(65) Prior Publication Data

US 2025/0076637 A1    Mar. 6, 2025

Related U.S. Application Data

(63) Continuation of application No. 17/823,404, filed on Aug. 30, 2022, now Pat. No. 11,953,676.

(51) Int. Cl.
| | |
|---|---|
| G02B 26/10 | (2006.01) |
| G01S 7/481 | (2006.01) |
| G02B 26/08 | (2006.01) |
| H03L 7/099 | (2006.01) |

(52) U.S. Cl.
CPC .......... *G02B 26/101* (2013.01); *G01S 7/4817* (2013.01); *G02B 26/0833* (2013.01); *H03L 7/0992* (2013.01)

(58) Field of Classification Search
CPC . G02B 26/101; G02B 26/0833; G01S 7/4817; H03L 7/0992; G09G 5/10; G09G 5/18; G06T 19/006
USPC ...................... 345/545; 359/213.1; 348/744; 331/116 M, 154
See application file for complete search history.

(56) References Cited

U.S. PATENT DOCUMENTS

| | | | | |
|---|---|---|---|---|
| 11,953,676 B2 * | 4/2024 | Druml | .................. | G02B 26/101 |
| 2023/0051926 A1 * | 2/2023 | Druml | ................ | G02B 26/0833 |
| 2024/0069329 A1 | 2/2024 | Druml et al. | | |

* cited by examiner

*Primary Examiner* — Arnold M Kinkead
(74) *Attorney, Agent, or Firm* — Harrity & Harrity, LLP

(57) ABSTRACT

A method of synchronizing a first oscillation about a first axis with a second oscillation about a second axis includes: generating a first position signal that indicates a position of the first oscillation about the first axis; generating a second position signal that indicates a position of the second oscillation about the first axis; determining a phase difference between the first and the second position signals; comparing the phase difference to a threshold value to generate a comparison result; generating a reference signal having a first frequency; synchronizing the first oscillation to the first frequency; and triggering a start of the reference signal responsive to the comparison result indicating that the phase difference is less than the threshold value.

20 Claims, 6 Drawing Sheets

FAST LISSAJOUS LOCK CONTROL AND SYNCHRONIZATION OF SCANNING AXES OF MICROELECTROMECHANICAL SYSTEMS

RELATED APPLICATION

This application is a continuation of U.S. patent application Ser. No. 17/823,404, filed Aug. 30, 2022, which is incorporated herein by reference in its entirety.

FIELD

The present disclosure relates generally to a microelectromechanical system (MEMS) oscillating system and method for operating the same, and, more particularly, to synchronizing oscillations about two or more scanning axes.

BACKGROUND

Lissajous scanning is a type of scanning implemented in display application, light scanning applications, and light steering applications, to name a few. For example, Lissajous scanning may be used in displays, Light Detection and Ranging (LIDAR), automotive headlights, and augmented reality goggles in which light beams are steered by a scanning system according to a Lissajous pattern.

Lissajous scanning is typically done by two resonant scanning axes which are each driven at constant scanning frequency with a defined frequency ratio/difference therebetween that forms a specific Lissajous pattern and frame rate. In order to implement Lissajous scanning properly, synchronization of the two scanning axes is required. However, starting up the system and achieving a Lissajous lock between scanning axes takes time. The system must typically wait until Lissajous lock before it can start transmitting light beams. Accordingly, a delay is achieving Lissajous lock is a delay in using the system.

Some applications require fast start-up and Lissajous lock, for example, to be achieved in less than a second. However, starting up a Lissajous system requires time, because a microelectromechanical system (MEMS) mirror's resonance curve has to be walked to the targeted working point. Synchronizing a MEMS axis for Lissajous requires time on top, because the axis has to be synchronized towards a reference frequency of a reference signal. In worst case, the reference signal and the axis signal are 180° offset in the phase domain. Compensating for large phase errors (between reference signal and the axis) certainly leads to a violation of the allowed total start-up time. This becomes even worse in case of narrow MEMS resonance curves. This is due to the fact that only small frequency shifts for control and compensation tasks can be performed without leading to collapse of the oscillation (i.e., falling from the top response curve down to the lower response curve of the MEMS mirror).

Accordingly, a scanning system that can achieve a Lissajous lock at system start-up as quickly as possible, thus speeding up the time until the scanning system is ready for shooting light beams, may be desirable.

SUMMARY

Embodiments provide microelectromechanical system (MEMS) mirror synchronizing system and methods for operating the same, and, more particularly, to synchronizing two scanning axes in a scanning system.

One or more embodiments provide an oscillator system, including: an oscillator structure configured to oscillate about a first axis according to a first oscillation and oscillate about a second axis according to a second oscillation; a first driver configured to generate a first drive signal to drive the first oscillation of the oscillator structure, monitor a first angular trajectory of the oscillator structure about the first axis, and generate a first position signal that indicates a position of the oscillator structure about the first axis based on the monitored first angular trajectory; a second driver configured generate a second drive signal to drive the second oscillation of the oscillator structure, monitor a second angular trajectory of the oscillator structure about the second axis, and generate a second position signal that indicates a position of the oscillator structure about the second axis based on the monitored second angular trajectory; a phase error detector configured to determine a phase difference between the first position signal and the second position signal; a comparator circuit configured to compare the phase difference to a threshold value and generate a comparison result; a reference signal generator configured to generate a first reference signal having a first frequency and a second reference signal having a second frequency; a synchronization circuit configured to synchronize the first oscillation to the first frequency and synchronize the second oscillation to the second frequency according to the first reference signal and the second reference signal, respectively; and a synchronization controller configured to monitor the comparison result and synchronously trigger a start of the first reference signal and the second reference signal when the comparison result indicates that the phase difference is less than the threshold value One or more embodiments provide an oscillator system, including: a first oscillator structure configured to oscillate about a first axis according to a first oscillation; a second oscillator structure configured to oscillate about a second axis according to a second oscillation; a first driver configured to generate a first drive signal to drive the first oscillation of the first oscillator structure, monitor a first angular trajectory of the first oscillator structure about the first axis, and generate a first position signal that indicates a position of the first oscillator structure about the first axis based on the monitored first angular trajectory; a second driver configured generate a second drive signal to drive the second oscillation of the second oscillator structure, monitor a second angular trajectory of the second oscillator structure about the second axis, and generate a second position signal that indicates a position of the second oscillator structure about the second axis based on the monitored second angular trajectory; a phase error detector configured to determine a phase difference between the first position signal and the second position signal; a comparator circuit configured to compare the phase difference to a threshold value and generate a comparison result; a reference signal generator configured to generate a first reference signal having a first frequency and a second reference signal having a second frequency; a synchronization circuit configured to synchronize the first oscillation to the first frequency and synchronize the second oscillation to the second frequency according to the first reference signal and the second reference signal, respectively; and a synchronization controller configured to monitor the comparison result and synchronously trigger a start of the first reference signal and the second reference signal when the comparison result indicates that the phase difference is less than the threshold value.

One or more embodiments provide a method of synchronizing a first oscillation about a first axis with a second oscillation about a second axis. The method includes: driving the first oscillation about the first axis using a first drive signal; driving the second oscillation about the second axis using a second drive signal; monitoring a first angular trajectory of the first oscillation about the first axis; monitoring a second angular trajectory of the second oscillation about the second axis; generating a first position signal that indicates a position of the first oscillation about the first axis based on the monitored first angular trajectory; generating a second position signal that indicates a position of the second oscillation about the first axis based on the monitored second angular trajectory; determining a phase difference between the first position signal and the second position signal; comparing the phase difference to a threshold value to generate a comparison result; generating a first reference signal having a first frequency and a second reference signal having a second frequency; synchronizing the first oscillation to the first frequency and synchronizing the second oscillation to the second frequency according to the first reference signal and the second reference signal, respectively; monitoring the comparison result; and synchronously triggering a start of the first reference signal and the second reference signal when the comparison result indicates that the phase difference is less than the threshold value.

BRIEF DESCRIPTION OF THE DRAWINGS

Embodiments are described herein making reference to the appended drawings.

DETAILED DESCRIPTION

Figure 1A:
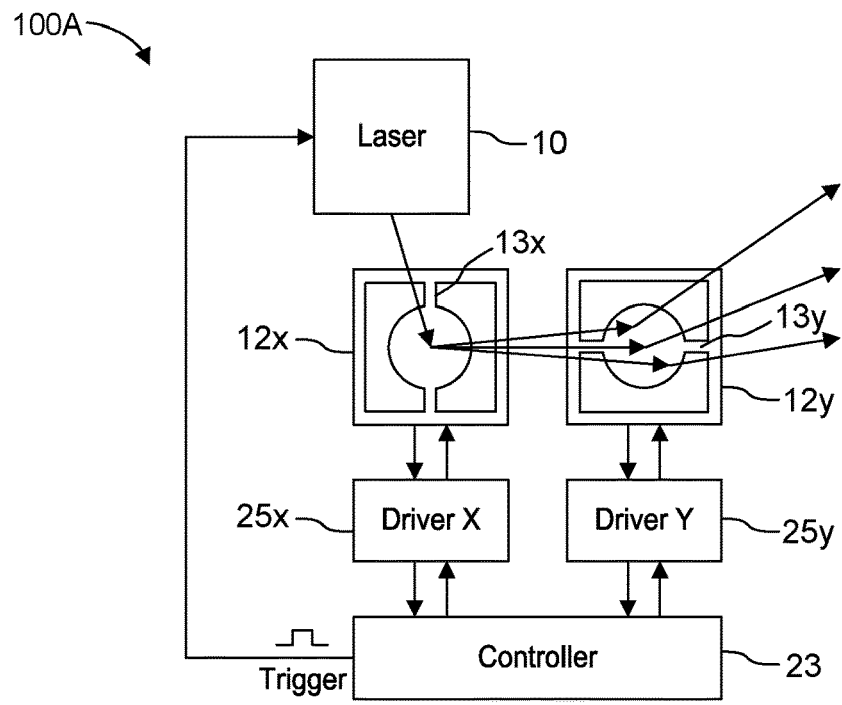
FIGS. 1A and 1B are a schematic block diagrams of Lissajous scanning systems according to one or more embodiments.

In the following, various embodiments will be described in detail referring to the attached drawings. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

Embodiments relate to optical sensors and optical sensor systems and to obtaining information about optical sensors and optical sensor systems. A sensor may refer to a component which converts a physical quantity to be measured to an electric signal, for example a current signal or a voltage signal. The physical quantity may, for example, comprise electromagnetic radiation, such as visible light, infrared (IR) radiation, or other type of illumination signal, a current, or a voltage, but is not limited thereto. For example, an image sensor may be a silicon chip inside a camera that converts photons of light coming from a lens into voltages. The larger the active area of the sensor, the more light that can be collected to create an image.

A sensor device as used herein may refer to a device which comprises a sensor and further components, for example biasing circuitry, an analog-to-digital converter, or a filter. A sensor device may be integrated on a single chip, although in other embodiments a plurality of chips or also components external to a chip may be used for implementing a sensor device.

Moreover, embodiments may relate to optical transmitters, optical scanners, and optical scanner systems configured to transmit light beams or pulses according to a scanning pattern, and, more particularly, according to a Lissajous scanning pattern. Light beams include visible light, infrared (IR) light, or other type of illumination signals. In some applications, the transmitted light may be scanned across an intended field of view.

In some applications, the transmitted light may be backscattered by an object back towards the system where the backscattered light is detected by a sensor. The sensor may convert the received backscattered light into an electric signal, for example a current signal or a voltage signal, that may be further processed by the system to generate object data and/or an image.

Lissajous scanning is a type of scanning implemented in display applications, light scanning applications, and light steering applications, to name a few. For example, Lissajous scanning may be used in displays, Light Detection and Ranging (LIDAR), and automotive headlights in which light beams are steered by a scanning system according to a Lissajous pattern. Lissajous scanning is typically done by two resonant scanning axes which are each driven at constant scanning frequency with a defined frequency ratio/difference therebetween that forms a specific Lissajous pattern and frame rate. In order to properly carry out Lissajous scanning, synchronization of the two scanning axes is required.

Lissajous scanning may be used in extended reality (XR) technologies. For example, augmented reality (AR) is a technology that augments physical environments on a mobile device screen by overlaying them with digital content. It adds digital elements to a live view. For example, a captured piece of an environment is augmented with digital information that is superimposed thereon. Thus, digital content is overlaid onto the captured piece of the environment to visually provide additional information to a user. The digital content may be displayed on a transparent substrate or display, such as smart eye-glasses, smart contact lenses, head-up displays (HUDs), and head-mounted displays (HMDs), or projected directly onto a user's retina, as is the case for virtual retinal displays.

Virtual reality (VR) is a technology that entirely replaces the real-world environment of a user with a computer-generated virtual environment. Thus, a user is presented with a completely digital environment in which computer-generated stereo visuals surround the user. In a VR simulated environment, a VR headset that provides 360-degree vision may be used.

A mixed reality (MR) experience combines elements of both AR and VR such that real-world and digital objects interact. Here, a real-world environment is blended with a virtual one.

These technologies, as well as others that enhance a user's senses, may be referred to as extended reality (XR) technologies. A microelectromechanical system (MEMS) mirror-based laser beam scanner (LBS), as the one described herein, is one way to implement XR technologies. The laser beam scanner is capable of delivering small form factor, low power consumption, and high brightness at a relatively low system cost.

In LIDAR systems, a light source transmits light pulses into a field of view and the light reflects from one or more objects by backscattering. In particular, LIDAR is a direct Time-of-Flight (TOF) system in which the light pulses (e.g., laser beams of infrared light) are emitted into the field of view, and a pixel array detects and measures the reflected beams. For example, an array of photodetectors receives reflections from objects illuminated by the light.

Differences in return times for each light pulse across multiple pixels of the pixel array can then be used to make digital 3D representations of an environment or to generate other sensor data. For example, the light source may emit a single light pulse, and a time-to-digital converter (TDC) electrically coupled to the pixel array may count from the time the light pulse is emitted, corresponding to a start signal, until a time the reflected light pulse is received at the receiver (i.e., at the pixel array), corresponding to a stop signal. The "time-of-flight" of the light pulse is then translated into a distance.

In another example, an analog-to-digital converter (ADC) may be electrically coupled to the pixel array (e.g., indirectly coupled with intervening elements in-between) for pulse detection and ToF measurement. For example, an ADC may be used to estimate a time interval between start/stop signals with an appropriate algorithm. For example, an ADC may be used detect an analog electrical signal from one or more photodiodes to estimate a time interval between a start signal (i.e., corresponding to a timing of a transmitted light pulse) and a stop signal (i.e., corresponding to a timing of receiving an analog electrical signal at an ADC) with an appropriate algorithm.

A scan such as an oscillating horizontal scan (e.g., from left to right and right to left of a field of view) or an oscillating vertical scan (e.g., from bottom to top and top to bottom of a field of view) can illuminate an area referred to as the "field of view" in a continuous scan fashion. Each firing of the laser beam by the light sources can result in a scan line in the field of view. By emitting successive light pulses in different scanning directions, an image can be projected into the field of view, as is the case in XR technologies, or the field of view can be scanned and objects within the area can be detected and imaged, as is the case in LIDAR technologies.

Figure 1B:
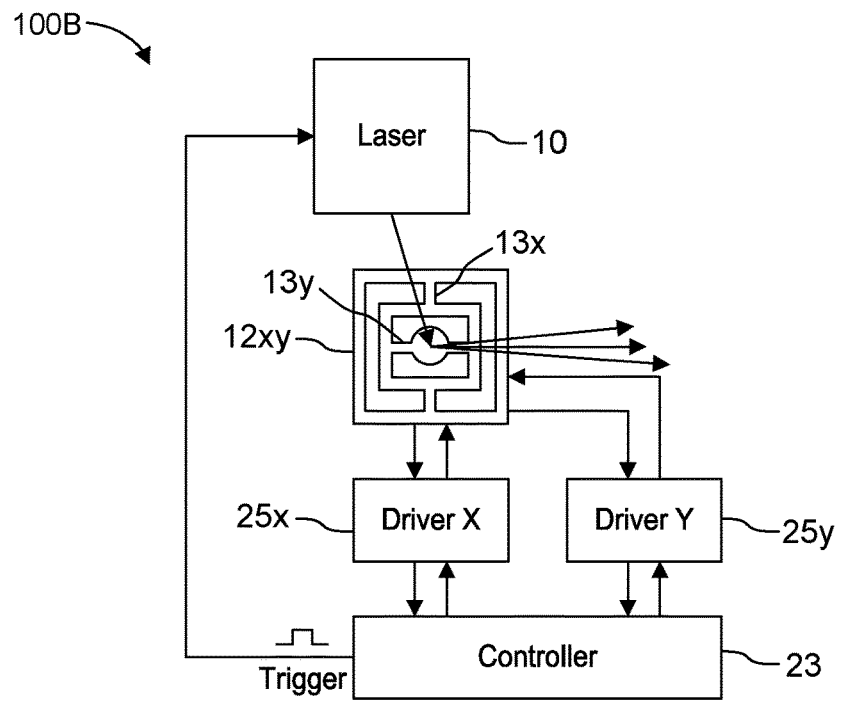

FIGS. 1A and 1B are a schematic block diagrams of Lissajous scanning systems 100A and 100B, respectively, according to one or more embodiments. In particular, the Lissajous scanning system 100A includes two one-dimensional (1D) MEMS mirrors 12x and 12y that are used to steer or otherwise deflect light beams (pulses) according to a Lissajous scanning pattern. In contrast, the Lissajous scanning system 100B includes a single two-dimensional (2D) MEMS mirror 12xy that is used to steer or otherwise deflect light beams (pulses) according to a Lissajous scanning pattern.

The MEMS mirrors 12x and 12y are mechanical moving mirrors (i.e., a MEMS micro-mirror) integrated on a semiconductor chip (not shown). A MEMS mirror according to the embodiments described herein is configured to oscillate via rotation about either a single resonant scanning axis (i.e., a 1D MEMS mirror) or two resonant scanning axes (i.e., a 2D MEMS mirror) that are typically orthogonal to each other. An oscillation of the MEMS mirror on a scanning axis may be done so between two predetermined extremum deflection angles (e.g., +/−15 degrees). A Lissajous scanner is configured to control the steering of the light beams in two dimensions (e.g., in a horizontal x-direction and in a vertical y-direction).

In the example shown in FIG. 1A, two 1D MEMS mirrors 12x and 12y are used to steer light beams in two dimensions. MEMS mirror 12x includes a first resonant scanning axis 13x that enables the MEMS mirror 12x to steer light in the x-direction, whereas MEMS mirror 12y includes a second resonant scanning axis 13y that enables the MEMS mirror 12yx to steer light in the y-direction. The two MEMS mirrors 12x and 12y are arranged sequentially along a transmission path of the light beams such that one of the MEMS mirrors (e.g., MEMS mirror 12x) first receives a light beam and steers it in a first dimension and the second one of the MEMS mirrors (e.g., MEMS mirror 12y) receives the light beam from the first MEMS mirror and steers it in a second dimension. As a result, the two MEMS mirrors 12x and 12y operate together to steer a light beam generated by an illumination unit 10 in two-dimensions. In this way, the two MEMS mirrors 12x and 12y can direct a light beam at a desired 2D coordinate (e.g., an x-y coordinate) in the field of view. Multiple light beams can be steered by the two MEMS mirrors 12x and 12y at different 2D coordinates of a Lissajous pattern.

In the example illustrated in FIG. 1B, one 2D MEMS mirror 12xy is used to steer light beams in two dimensions. MEMS mirror 12xy includes the first resonant scanning axis 13x that enables the MEMS mirror 12xy to steer light in the x-direction and the second resonant scanning axis $13y$ that enables the MEMS mirror $12xy$ to steer light in the y-direction. In this way, a single MEMS mirror can steer light beams received from the illumination unit 10 in both the x-direction and the y-direction. As a result, the MEMS mirror $12xy$ can direct a light beam at a desired 2D coordinate (e.g., an x-y coordinate) in the field of view. Multiple light beams can be steered by the MEMS mirror $12xy$ at different 2D coordinates of a Lissajous pattern.

Each MEMS mirror $12x$, $12y$, and $12xy$ is a resonator (i.e., a resonant MEMS mirror) configured to oscillate "side-to-side" about each of its scanning axes at a resonance frequency such that the light reflected from the MEMS mirror oscillates back and forth in a scanning direction of a respective scanning axis. As will be described in further detail below, different resonance frequencies may be used for each scanning axis $13x$ and $13y$ for defining the Lissajous pattern.

For each scanning axis, the MEMS mirrors $12x$, $12y$, and $12xy$ includes an actuator structure used to drive the mirror about its respective scanning axis. The actuator structure may include interdigitated finger electrodes made of interdigitated mirror combs and frame combs to which a drive voltage (i.e., an actuation signal or driving signal) is applied by the MEMS driver. Applying a difference in electrical potential between interleaved mirror combs and frame combs creates a driving force between the mirror combs and the frame combs, which creates a torque on the mirror body about the intended scanning axis. The drive voltage can be toggled between two voltages resulting in an oscillating driving force. The oscillating driving force causes the mirror to oscillate back and forth on its rotation axis between two extrema. Depending on the configuration, this actuation can be regulated or adjusted by adjusting the drive voltage off time, a voltage level of the drive voltage, or a duty cycle.

In other examples, actuation methods may include electromagnetic actuation and piezoelectric actuators. In electromagnetic actuation, the micro mirror may be "immersed" in a magnetic field and an alternating electric current through conductive paths may create the oscillating torque around the scanning axis. Piezoelectric actuators may be integrated in the leaf springs or the leaf springs may be made of piezoelectric material to produce alternating beam bending forces in response to an electrical signal and generate the oscillation torque.

MEMS mirrors $12x$, $12y$, and $12xy$ exhibit a non-linear behavior due the torsional stiffness about the rotation axis caused by the leaf spring assemblies such that an oscillation frequency of the mirror increases with an increase in oscillation amplitude (i.e., tilt angle amplitude) in a non-linear manner. Thus, the stiffening of the leaf springs as the mirror rotates causes the MEMS mirror to be more strongly non-linear.

The Lissajous scanning systems 100A and 100B each includes an illumination unit 10 (i.e., a light transmitter) that includes at least one light source (e.g., at least one laser diode or light emitting diode) that is configured to transmit light beams (pulses) along a transmission path towards the MEMS mirror(s). The illumination unit 10 may sequentially transmit multiple light pulses according to a trigger signal received from a system controller 23.

The Lissajous scanning systems 100A and 100B also include a system controller 23 that is configured to control components of the scanning systems. In certain applications, such as LIDAR, the system controller 23 may also be configured to receive raw data from a light sensor (not illustrated) and perform processing thereon (e.g., via digital signal processing) for generating object data (e.g., point cloud data). Thus, the system controller 23 includes at least one processor and/or processor circuitry (e.g., comparators, TDCs, ADCs, and digital signal processors (DSPs)) of a signal processing chain for processing data, as well as control circuitry, such as a microcontroller, that is configured to generate control signals.

The system controller 23 is configured to generate a trigger signal used to trigger the illumination unit 10 to generate light pulses. Thus, the system controller 23 controls the timing light pulses are fired from the illumination unit 10 via the trigger signal. The system controller 23 is also configured to set a driving frequency of a MEMS mirror for each of its scanning axes and is capable of synchronizing the oscillations about the two scanning axes $13x$ and $13y$. In particular, the system controller 23 is configured to control an actuation of a MEMS mirror about each scanning axis by controlling a driving signal. The system controller 23 may control a frequency, a phase, a duty cycle, a high-voltage (HV) level, and/or a low-voltage (LV) level of the driving signal to control the actuation.

The Lissajous scanning systems 100A and 100B both include a MEMS driver $25x$ for driving a MEMS mirror (i.e., MEMS mirror $12x$ or $12xy$) about the first scanning axis $13x$ and a MEMS driver $25y$ for driving a MEMS mirror (i.e., MEMS mirror $12y$ or $12xy$) about the second scanning axis $13y$. Each MEMS driver $25x$, $25y$ actuates and senses the rotation position of the mirror about its respective scanning axis, and provides position information (e.g., tilt angle or degree of rotation about the rotation axis) of the mirror to the system controller 23. Based on this position information, the laser sources of the illumination unit 10 may be triggered by the system controller 23. Thus, a higher accuracy in position sensing of the MEMS mirror results in a more accurate and precise control of other components of the scanning system.

As noted above, a drive voltage (i.e., an actuation signal or driving signal) is applied by a MEMS driver to an actuator structure of the MEMS mirror that corresponds to its corresponding scanning axis to drive the oscillation of the MEMS mirror about that scanning axis. The drive voltage can be switched or toggled between an HV level and a LV level resulting in an oscillating driving force. The LV level of the driving signal is zero when the drive voltage is off but may also be a non-zero value. When the LV level is zero, it can be said that the drive voltage is toggled on and off (HV on/off). The oscillating driving force causes the mirror to oscillate back and forth on its rotation axis between two extrema. The drive voltage may be a constant drive voltage, meaning that the drive voltage is the same voltage when actuated (i.e., toggled on) or one or both of the HV and LV levels of the driving signal may be adjustable. However, it will be understood that the drive voltage is being toggled between HV and LV levels in order to produce the mirror oscillation. Depending on the configuration, this actuation can be regulated or adjusted by adjusting the drive voltage off time, a voltage level of the drive voltage, or a duty cycle. As noted above, frequency and phase of the driving signal can also be regulated and adjusted.

Hence, a light transmission technique includes transmitting the beams of light into the field of view from one or two transmission mirrors that use two resonant scanning axes to transmit according to a Lissajous scanning pattern. The transmission mirrors continuously oscillate in resonance about each scanning axes such that the beams of light are projected into the field of view that moves across the field of view as the transmission mirror(s) changes the transmission direction. Moreover, additional conditions are set by the system controller 23 in order to synchronize the oscillations about the two scanning axes for generating a Lissajous scanning pattern as a repeatable pattern.

To make the Lissajous pattern reproduce itself periodically with a frame rate FR frequency [Hz], the two resonant scanning axes are each driven at a target scanning frequency f1, f2 with a defined frequency ratio/difference therebetween that forms a repeatable Lissajous pattern (frame) with a frame rate FR. A new frame begins each time the Lissajous pattern restarts, which occurs when a phase difference between a mirror phase about scanning axis 13x and a mirror phase about scanning axis 13y is zero. The system controller 23 synchronizes the oscillations about the two resonant scanning axes to ensure this defined frequency ratio/difference is maintained based on measurements acquired of the oscillations.

In the examples described herein, frequency f1 is the driving frequency in the time domain of a MEMS mirror (e.g., MEMS mirror 12x or 12xy) about the scanning axis 13x and frequency f2 is the driving frequency in the time domain of a MEMS mirror (e.g., MEMS mirror 12y or 12xy) about the scanning axis 13y. The oscillations about the two scanning axes may drift out of synchronization and must be brought into synchronization by the system controller 23.

Figure 2:
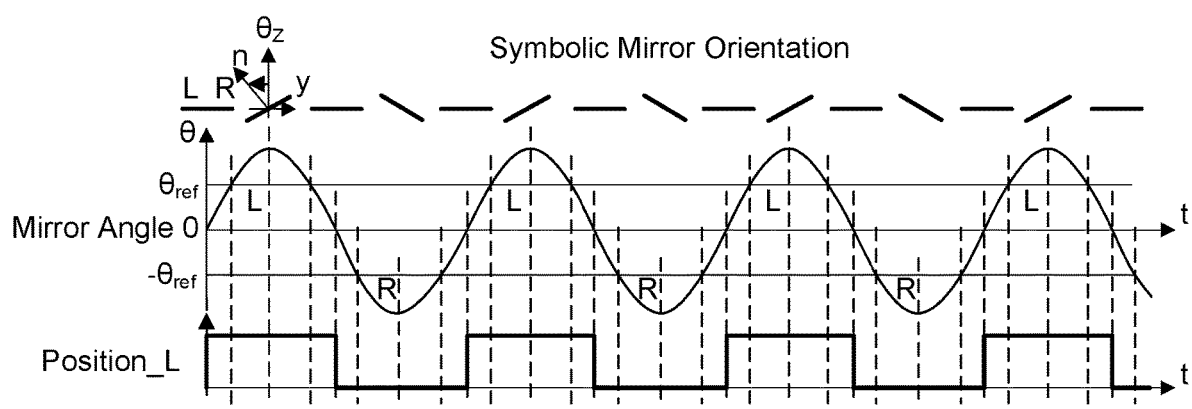
FIG. 2 illustrates a signal diagram of various signals generated by a MEMS driver based on a mirror angle θ and/or position according to one or more embodiments.

FIG. 2 illustrates a signal diagram of various signals generated by a respective MEMS driver 25x, 25y based on the mirror angle θ and/or position, including a position signal (Position_L). For example, the position signal (Position_L) may be a pulsed signal during which a first pulse transition (e.g., falling-edge transition) is triggered at a zero-crossing as the mirror oscillates in a first rotation direction (e.g., from left to right) and a second pulse transition (e.g., rising-edge transition) is triggered at a zero-crossing as the mirror oscillates in a second rotation direction (e.g., from right to left). Furthermore, the signal is "high" when the mirror points in one direction (e.g., points left) and the signal is "low" when the mirror points in a second direction (e.g., points right). Thus, the position signal not only indicates a zero-crossing event by triggering a pulse transition, but also indicates absolute phase information by indicating the directional tilt of the mirror. As the intervals between zero-crossing events increase, the frequency of the position signal decreases. Thus, the position signal is also representative of a measured frequency of a MEMS mirror about a scanning axis.

Alternatively, a short pulse may be generated by each MEMS driver 25x and 25y at the each zero-crossing event such that a pulsed position signal (Position_L) is output to the system controller 23. That is, the signal remains low (or high) between zero-crossing pulses. In this case, the absolute phase information indicating in which direction the mirror is moving would be absent. Based on this position signal a phase and/or a frequency of two or more position signals can be compared.

In other words, each MEMS driver 25x, 25y monitors an angular trajectory of the oscillation about its respective scanning axis and generates a respective position signal that indicates a position of the oscillation about the respective scanning axis based on the monitored angular trajectory. In this case, two position signals (Position_L) are generated, one by each driver 25x and 25y. For example, each MEMS driver 25x and 25 may continuously sense the position of the oscillation about its respective scanning axis and generate a zero-crossing signal that is indicative of detected (actual) zero-crossing events. Each MEMS driver 25x and 25y may then generate a respective position signal (Position_L) based on the zero-crossing signal for use by a synchronization circuit included in the system controller 23. Alternatively, each MEMS driver 25x and 25y may output its respective zero-crossing signal to the system controller 23 and the system controller may generate the respective position signals (Position_L) based on a respective zero-crossing signal.

Based on a position signal Position_L, at least one of phase or frequency information of a MEMS mirror can be extracted from the position signal as a measurement of an actual state of the MEMS mirror about a respective scanning axis. Accordingly, driver 25x is configured to receive a measurement signal representative of an entire angular trajectory traversed by the MEMS mirror throughout its oscillation, detect zero-crossing events at which a value of the measurement signal is detected to be equal to predefined value that corresponds to a zero displacement angle of the MEMS mirror structure with respect to the axis 13x, and generate a position signal Position_L that indicates each of the detected first zero-crossing events with a signal transition or a signal pulse. Likewise, driver 25y is configured to receive a measurement signal representative of an entire angular trajectory traversed by the MEMS mirror throughout its oscillation, detect zero-crossing events at which a value of the measurement signal is detected to be equal to predefined value that corresponds to a zero displacement angle of the MEMS mirror structure with respect to the axis 13y, and generate a position signal Position_L that indicates each of the detected first zero-crossing events with a signal transition or a signal pulse.

A measurement signal may be provided to a driver in the following manner. As the mirror oscillates, the capacitance between the finger electrodes changes according to the mirror's rotation position. A MEMS driver is configured to measure the capacitance between the interdigitated finger electrodes, and determine a rotation position or angle position of the MEMS mirror therefrom. By monitoring the capacitance, the MEMS driver can detect the zero-crossing events and a timing thereof, and can determine the tilt angle of the MEMS mirror. It can also generate the position signal by monitoring the capacitance. The MEMS driver can also use the measured capacitance to determine a mirror frequency, and record the information in memory at the MEMS driver or at the system controller.

The sensing of the position of a MEMS mirror is performed based on a detector that is configured to measure the capacitance. For example, as the MEMS mirror moves, the geometry of the finger structure changes, resulting in a change in the geometry of the capacitance. As the geometry of the capacitance changes, the capacitance itself changes. Thus, a specific capacitance corresponds directly with a specific position (i.e., tilt angle) of the MEMS mirror. By sensing the capacitance of the finger structure, the MEMS driver can monitor and track the oscillations of the mirror, and determine a specific position of the MEMS mirror, including the zero-crossing.

One way to measure the capacitance is to measure a current flowing through the finger structure, convert the measured current into a voltage, and then further correlate the voltage to a capacitance and/or a rotation angle. However, any method to measure the capacitance may be used. A rotation direction (e.g., positive or negative, left-to-right or right-to-left, clockwise or counter-clockwise, etc.) is also detected by measuring a change in capacitance over time, where a positive or a negative change indicates opposing rotation directions. The MEMS driver can also record the currents and voltages measured during the measuring of the capacitance. Thus, increasing the accuracy of position sensing of the mirror may improve the overall accuracy of the LIDAR system.

Each MEMS driver 25x and 25y may send respective position information to the system controller 23 so that the system controller 23 can use the position information to control the triggering of the laser pulses of the illumination unit 10. The position information may also be used by the system controller 23 as feedback information such that the system controller 23 can maintain a stable operation of the MEMS mirror 12xy via control signals provided to the MEMS drivers 25x and 25y and also maintain synchronization with other MEMS mirrors. The position information may also be used by the system controller 23 to achieve a fast Lissajous lock between the two oscillations at start-up of the system, thus speeding up the time until the scanner is ready for shooting the light beams.

Hence, a scanning technique includes transmitting the beams of light into the field of view from a transmission mirror that uses two resonant scanning axes to transmit according to a Lissajous scanning pattern. The transmission mirror continuously oscillates in resonance about each scanning axis such that the beams of light are projected into the field of view that moves across the field of view as the transmission mirror changes the transmission direction. Moreover, additional conditions are set by the system controller 23 in order to generate a Lissajous scanning pattern.

The system controller 23 may include at least one processor and/or a state machine that monitors the position signals Position_L from both drivers 25x and 25y during a start-up phase of the system and waits until they satisfy a phase condition before Lissajous synchronization begins. For example, the phase condition may be that the phase difference between the position signals Position_L is less than (e.g., becomes less than) a threshold value during the start-up phase. Once the phase difference is less than the threshold value, Lissajous synchronization of the two oscillations about the two scanning axes is initiated. By waiting until this phase condition is satisfied during the start-up phase, the Lissajous synchronization starts in an optimized phase condition, compared to a worst case phase error of 180° when starting at an arbitrary point in time. As a result, time required until the scanning system is ready for shooting light beams is reduced significantly.

Figure 3:
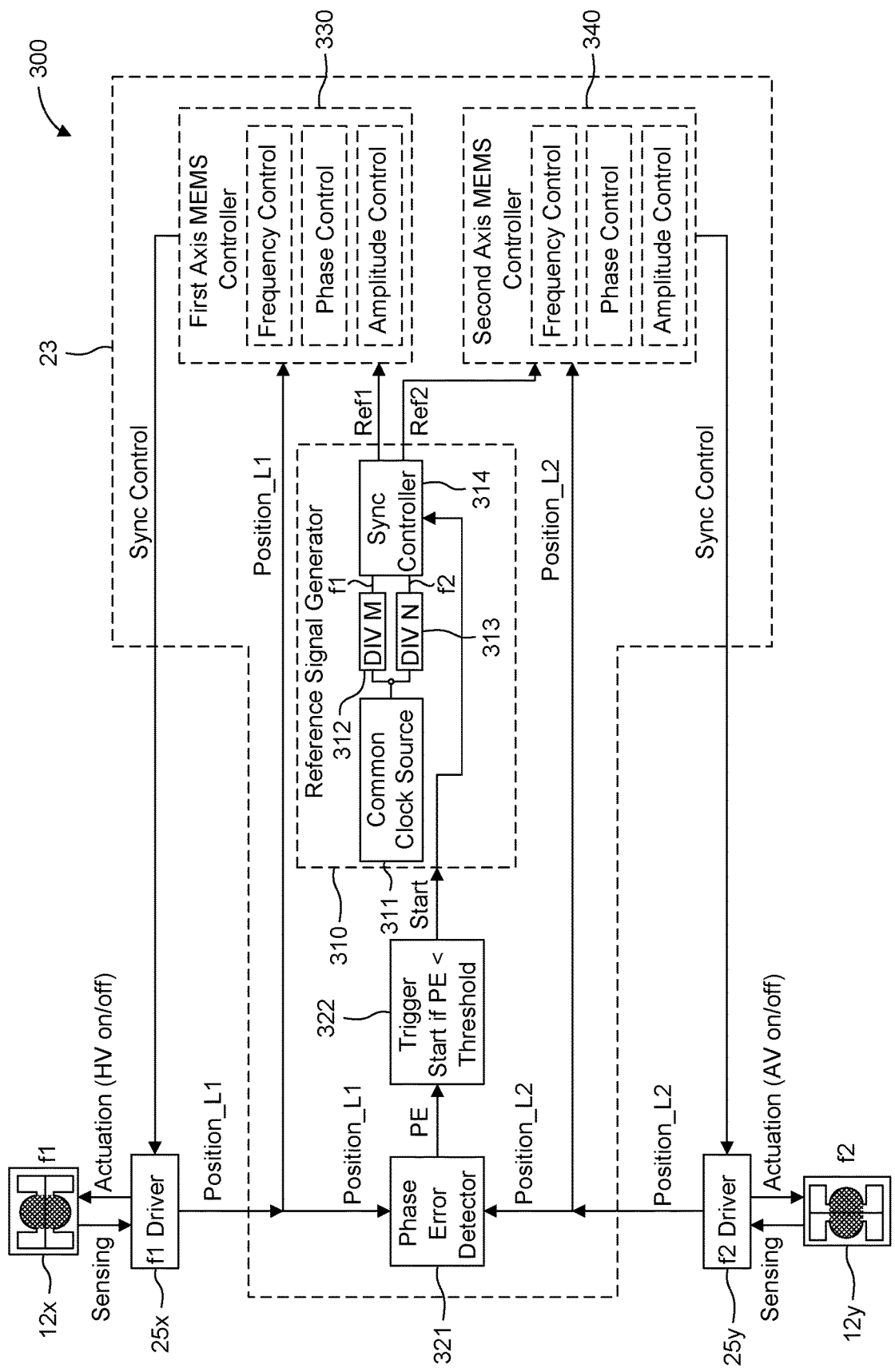
FIG. 3 illustrates a schematic block diagram of a scanning system according to one or more embodiments.

FIG. 3 illustrates a schematic block diagram of a scanning system 300 according to one or more embodiments. The scanning system 300 includes a MEMS mirror 12x, a MEMS driver 25x operably coupled to the MEMS mirror 12x, a MEMS mirror 12y, a MEMS driver 25y operably coupled to the MEMS mirror 12y, and a system controller 23 (i.e., a synchronization circuit) operatively coupled to the MEMS driver 25x and the MEMS driver 25y. While two 1D MEMS mirrors are illustrated in this example, it will be appreciated that the two MEMS mirrors 12x and 12y can be replaced with a single 2D MEMS mirror, as illustrated in FIG. 1B.

The scanning system 300 can employ phase synchronization control, frequency synchronization control, and/or amplitude synchronization control for both scanning axes 13x and 13y. Both scanning axes are operated in an open loop phase-locked loop (PLL) control mode. A respective target frequency is imprinted on each scanning axis and is therefore rock-solid stable. The phase between expected zero-crossings (ZC) and measured zero-crossings is controlled via change in actuation of the driving signal.

The scanning system 300 includes a reference signal generator 310 that generates two reference signals Ref1 and Ref2 having reference frequencies (i.e., target frequencies) f1 and f2, respectively. Both reference signals Ref1 and Ref2 can be generated by any suitable clock source such as crystal oscillator 311 or an FPGA (not illustrated). In one example, the reference frequencies f1 and f2 are set at 2200 Hz and 2300 Hz, respectively, but are not limited thereto. Since reference frequency f1 is lower than reference frequency f2, reference frequency f1 may be referred to as the slow axis frequency and reference frequency f2 may be referred to as the fast axis frequency. However, it will be appreciated that reference frequency f1 could be set to be higher than reference frequency f2 and could therefore be the faster axis frequency.

In this example, the reference signal generator 310 uses a crystal oscillator 311 to generate a clock signal, a divider 312 that divides the clock signal by integer M, and a divider 313 that divides the clock signal by integer N to generate two reference signals Ref1 and Ref2 that have a defined fractional relationship at which mirrors 12x and 12y operate about their respective axes 13x and 13y. The dividers 312 and 313 are configured to maintain the defined fractional relationship between the oscillation frequencies of the two axes based on integers N and M (N≠M, with X, M, and N being positive integers).

The output of each divider is a reference clock signal that has a respective target frequency f1 or f2. The reference signal generator 310 further includes a synchronization controller 314 that synchronizes a start of the reference signals Ref1 and Ref2 when the two position signals Position_L1 and Position_L2 satisfy a predetermined phase condition during a start-up phase of the scanning system 300. For example, the synchronization controller 314 may reset the reference signals Ref1 and Ref2 in order to synchronously trigger a start of the first reference signal Ref1 and the second reference signal Ref2. When started, the reference signals Ref1 and Ref2 start on a same transition edge type (i.e., either on a rising transition edge or a falling transition edge).

Following the start of the first reference signal Ref1 and the second reference signal Ref2, the MEMS drivers 25x and 25y are configured to regulate their respective drive signals HV to drive their respective MEMS mirrors at their respective target frequencies via feedback control through the system controller 23. For example, MEMS driver 25x is configured to regulate a first drive signal to drive the first oscillation at the first frequency f1 based on the first reference signal Ref1 and position signal Position_L1. Similarly, MEMS driver 25y is configured to regulate the second drive signal to drive the second oscillation at the second frequency f2 based on the second reference signal Ref2 and position signal Position_L2.

The system controller 23 includes a phase error detector 321 configured to determine a phase difference between the first position signal Position_L1 and the second position signal Position_L2. The phase error detector 321 generates and outputs the phase difference as a phase error PE.

The system controller 23 further includes a comparator circuit 322 that compares the phase difference (e.g., the phase error PE) to a predetermined threshold value and generates a comparison result. In particular, the determines whether or not the phase difference is greater than the predetermined threshold value. The comparison result may be set to a logic low value (e.g., 0) when the phase difference is greater than or equal to the predetermined threshold value and a logic high value (e.g., 1) when the phase difference is less than the predetermined threshold value, or vice versa. In either case, the comparator circuit 322 generates a start trigger signal when the phase difference is less than (e.g., initially becomes less than) the predetermined threshold value during the start-up phase of the scanning system 300.

In other words, the comparison result serves as the start trigger signal when the phase condition is satisfied.

The comparison result is provided to the synchronization controller 314, which monitors the comparison result for the start trigger signal. When the comparison result indicates that the phase difference of the position signals is less than the predetermined threshold value, the synchronization controller 314 synchronously triggers a start of the first reference signal Ref1 and the second reference signal Ref2.

In addition, the system controller 23 may monitor the comparison result of the comparator circuit 322 for an indication that the phase condition has been satisfied and disable the phase error detector 321 and/or the comparator circuit 322 once the system controller 23 detects that the phase condition has been satisfied for the first time in a startup operation so that a reinitialization of the first and the second reference signals is not triggered again during the same runtime operation. In other words, once the system controller 23 detects the very first Lissajous start condition after system startup, at least one of the phase error detector 321 and the comparator circuit 322 is disabled by the system controller 23. The system controller 23 may re-enable the phase error detector 321 and the comparator circuit 322 at each system startup so that the very first Lissajous start condition for each system startup can be detected.

As noted above, position information is used by the system controller 23 to achieve a fast Lissajous lock between the two oscillations at start-up of the system, thus speeding up the time until the scanner is ready for shooting the light beams. Thus, the synchronization controller 314 is configured to monitor the comparison result during a start-up phase of the scanning system 300. An end of the start-up phase is demarked by a first instance the comparison result indicates that the phase difference between the two position signals is less than the predetermined threshold value. The synchronization controller disables or stops monitoring the comparison result at the end of the start-up phase (i.e., when the first occurrence of the comparison result indicating that the phase difference between the two position signals is less than the predetermined threshold value).

The system controller 23 further includes a synchronization circuit configured to synchronize the first oscillation about the first scanning axis 13x to the first reference frequency f1 according to the first reference signal Ref1 and synchronize the second oscillation about the second scanning axis 13y to the second frequency f2 according to the second reference signal Ref2.

The synchronization circuit includes a first axis MEMS controller 330 and a second axis MEMS controller 340. The first axis MEMS controller 330 includes at least one of frequency control, phase control, or amplitude control to generate control signals for controlling a driving signal generated by the MEMS driver 25x. In particular, the first axis MEMS controller 330 receives the first reference signal Ref1 and the first position signal Position_L1, evaluates an error between the first reference signal Ref1 and the first position signal Position_L1, and performs at least one of frequency control, phase control, or amplitude control based on the error. The error may be a phase error, a frequency error, or both.

For example, the first axis MEMS controller 330 may include a phase frequency detector that receives the first reference signal Ref1 and the first position signal Position_L1, generates a phase error, a frequency error, or both based on a phase and/or frequency difference therebetween. The first axis MEMS controller 330 may further include a loop filter that changes the actuation phase of the driving signal generated by the MEMS driver 25x based on a phase error. The loop filter may change the actuation phase of the driving signal by changing the duty cycle, the HV level, and/or the LV level of the driving signal. Consequently, the phase error will be controlled to a minimum to drive the phase error to zero without affecting the reference frequency. Additionally, or alternatively, the loop filter may change the frequency of the driving signal based on a frequency error to drive the frequency error to zero.

Accordingly, the first axis MEMS controller 330 is configured to receive the first reference signal Ref1 and the first position signal Position_L1 and generate a synchronization control signal based on a difference between the first reference signal Ref1 and the first position signal Position_L1. The first MEMS driver 25x is configured to receive the first synchronization control signal and regulate the first drive signal to drive the first oscillation at the first frequency f1 based on the first synchronization control signal.

Similarly, the second axis MEMS controller 340 includes at least one of frequency control, phase control, or amplitude control to generate control signals for controlling a driving signal generated by the MEMS driver 25y. In particular, the second axis MEMS controller 340 receives the second reference signal Ref2 and the second position signal Position_L2, evaluates an error between the second reference signal Ref2 and the second position signal Position_L2, and performs at least one of frequency control, phase control, or amplitude control based on the error. The error may be a phase error, a frequency error, or both.

For example, the second axis MEMS controller 340 may include a phase frequency detector that receives the second reference signal Ref21 and the second position signal Position_L2, generates a phase error, a frequency error, or both based on a phase and/or frequency difference therebetween. The second axis MEMS controller 340 may further include a loop filter that changes the actuation phase of the driving signal generated by the MEMS driver 25y based on a phase error. The loop filter may change the actuation phase of the driving signal by changing the duty cycle, the HV level, and/or the LV level of the driving signal. Consequently, the phase error will be controlled to a minimum to drive the phase error to zero without affecting the reference frequency. Additionally, or alternatively, the loop filter may change the frequency of the driving signal based on a frequency error to drive the frequency error to zero.

Accordingly, the second axis MEMS controller 340 is configured to receive the second reference signal Ref2 and the second position signal Position_L2, and generate a synchronization control signal based on a difference between the second reference signal Ref2 and the second position signal Position_L2. The second MEMS driver 25y is configured to receive the second synchronization control signal and regulate the second drive signal to drive the second oscillation at the second frequency f2 based on the second synchronization control signal.

Thus, following the synchronized start of the first reference signal Ref1 and the second reference signal Ref2, the first MEMS driver 25x is configured to regulate the first drive signal to drive the first oscillation at the first reference frequency f1 and the second MEMS driver 25y is configured to regulate the second drive signal to drive the second oscillation at the second reference frequency f2.

Figure 4:
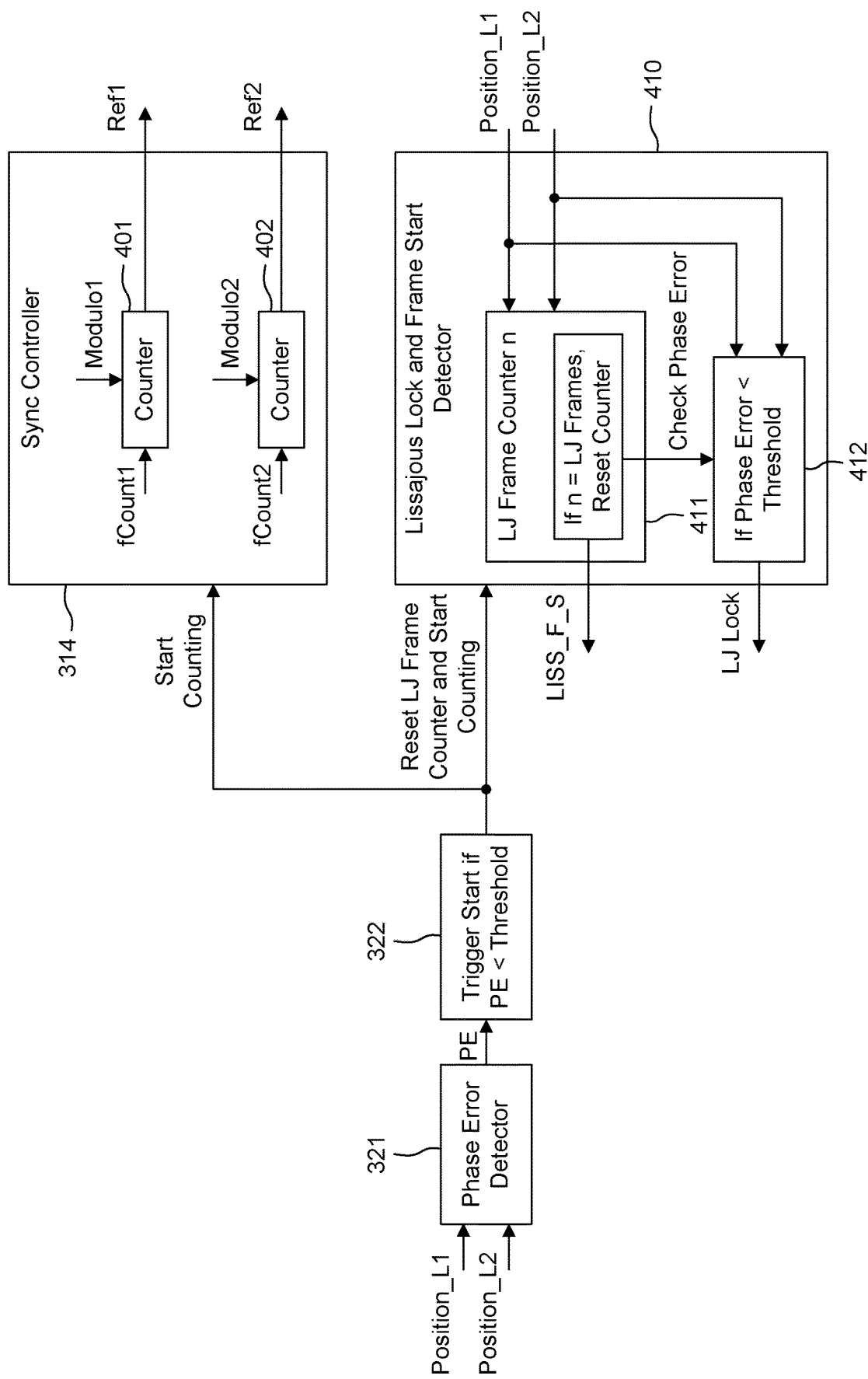
FIG. 4 illustrates a schematic block diagram of synchronization and Lissajous lock circuit of a system controller according to one or more embodiments.

FIG. 4 illustrates a schematic block diagram of synchronization and Lissajous lock circuit of a system controller 23 according to one or more embodiments. In this example, the synchronization controller 314 includes a first counter 401 that generates the first reference signal Ref1 by triggering signal pulses of the first reference signal Ref1 according to the first reference clock signal generated by divider 312. For example, counter parameters fcount1 and modulo1 may be calculated by the synchronization controller 314 based on the first reference clock signal such that the first reference signal Ref1 has the first reference frequency f1. Counter parameter fcount1 is the frequency that is the counter 401 uses for counting one value up and counter parameter modulo1 is the counter value at which the counter 401 wraps back to 0. When the synchronization controller 314 receives the start trigger signal, it may set the counter parameter modulo1 back to zero so that a first signal edge is triggered.

The synchronization controller 314 further includes a second counter 402 that generates the second reference signal Ref2 by triggering signal pulses of the second reference signal Ref2 according to the second reference clock signal generated by divider 313. For example, counter parameters fcount2 and modulo2 may be calculated by the synchronization controller 314 based on the second reference clock signal such that the second reference signal Ref2 has the second reference frequency f2. Counter parameter fcount2 is the frequency that is the counter 402 uses for counting one value up and counter parameter modulo2 is the counter value at which the counter 402 wraps back to 0. When the synchronization controller 314 receives the start trigger signal, it may set the counter parameter modulo2 back to zero so that a first signal edge is triggered.

As a result of receiving the start trigger signal from the comparator circuit 322, both counters 401 and 402 are synchronously initialized or reset such that the start of the first reference signal Ref1 and the second reference signal Ref2 are synchronously triggered.

The system controller 23 further includes a Lissajous lock and frame start detector circuit 410, which includes a frame start detector 411 and a Lissajous lock detector 412.

The frame start detector 411 generates a LISS_F_S pulse that marks the start of a Lissajous frame. A Lissajous frame is made of a certain number of first axis swings and second axis swings. In general, the frame start detector 411 counts the number of swings of one axis and when a defined value n is reached, then the LISS_F_S pulse is generated. However, the frame start detector 411 also generates the LISS_F_S pulse (i.e., a frame start detection signal) when the comparison result of the comparator circuit 322 indicates that the phase difference is less than the threshold value. In this way, the LISS_F_S pulse is triggered synchronously with the start of the first reference signal Ref1 and the second reference signal Ref2. This LISS_F_S pulse demarks the very first Lissajous frame of a scanning operation and indicates that the start-up phase is complete. In other words, the frame start detector 411 triggers a start of a Lissajous frame when the comparison result indicates that the phase difference is less than the threshold value and the start of the Lissajous frame is synchronous with the start of the first reference signal and the second reference signal.

Alternatively, the Lissajous frame start detector 411 could monitor a phase difference between the position signals Position_L1, Position_L2 on its own and determines a start of the first (the initial frame after startup) Lissajous frame based thereon. In particular, the Lissajous frame start detector 411 can detect a start of the first Lissajous frame when the phase difference between the position signals determined by its phase detector meets the phase condition (e.g., the phase difference is less than the threshold value).

Thus, the Lissajous frame start detector 411 is configured to generate and output a frame start detection signal pulse LISS_F_S pulse for the first Lissajous frame upon detecting that the phase condition has been satisfied. The Lissajous frame start detector 411 may generate the frame start detection signal pulse LISS_F_S pulse for subsequent Lissajous frames based on the certain number of first axis swings and second axis swings that define an interval of a Lissajous frame. In other words, the number of first axis swings and second axis swings can be counted to determine the start of the next Lissajous frame. The next frame signal may be output to a signal processor that processes image data received by LIDAR sensors that utilize the scanning mirrors 12x and 12y. In particular, the signal processor may use the next frame signal to identify a start of a new frame of image data, and thus an end of a current frame.

Additionally, the Lissajous lock detector 412 receives the two position signals Position_L1 and Position_L2, evaluates the phase difference therebetween at the beginning of the Lissajous frame, and generates a Lissajous lock signal LJ Lock when the comparison result indicates that the phase difference is less than the predetermined threshold value. This comparison is the same as that performed by comparator circuit 322. Alternatively, the Lissajous lock detector 412 may receive the comparison result directly from the comparator circuit 322. The Lissajous lock signal LJ Lock may be used to disable the monitoring of the comparison result by the synchronization controller 314, or may be used to disable the phase error detector 321 or the comparator circuit 322 so that a reinitialization of the first and the second reference signals is not triggered again during the same runtime operation. Additionally, or alternatively, the Lissajous lock signal can be used by functional safety or eye safety monitors to stop laser shooting when a Lissajous lock is not achieved.

Figure 5:
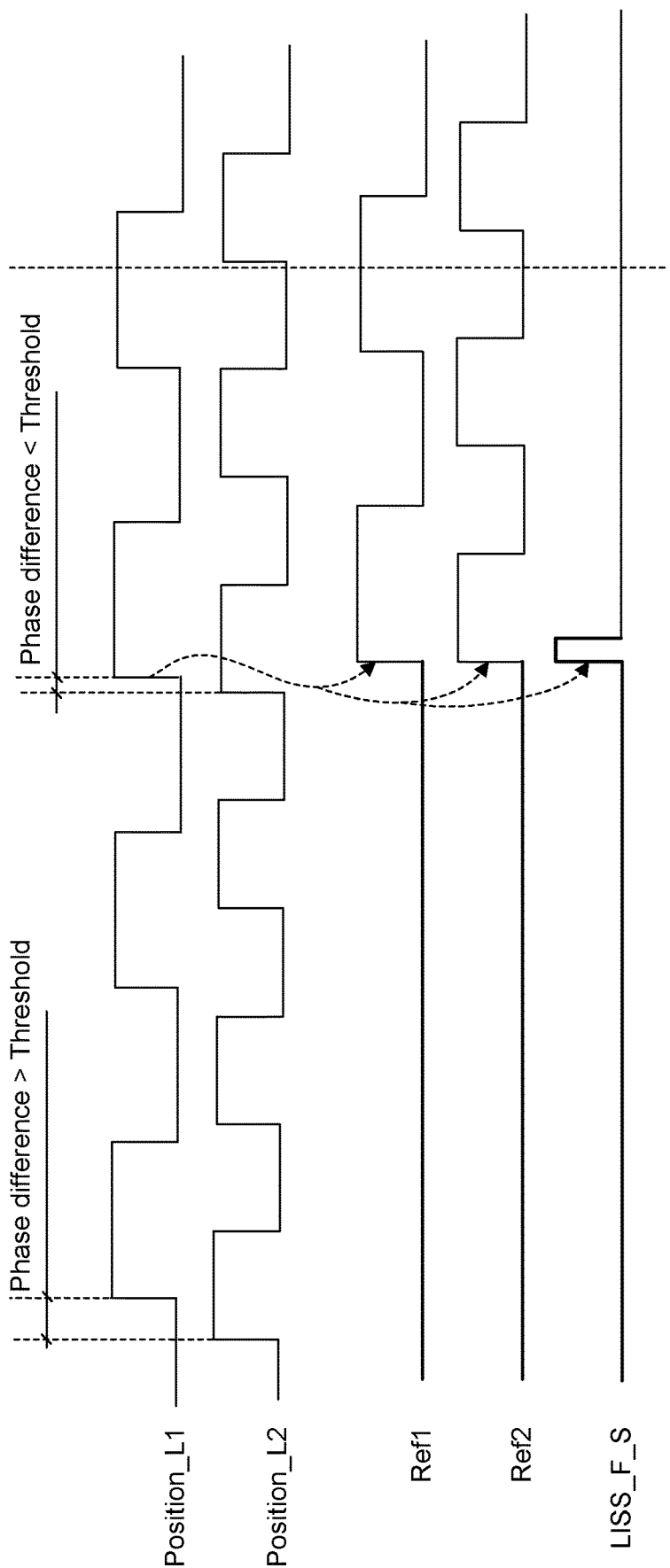
FIG. 5 illustrates a signal diagram of various signals generated by a scanning system during a start-up phase of the scanning system according to one or more embodiments.

FIG. 5 illustrates a signal diagram of various signals generated by a scanning system during a start-up phase of the scanning system according to one or more embodiments. The various signals include position signal Position_L1 generated by MEMS driver 25x, position signal Position_L2 generated by MEMS driver 25y, first reference signal Ref1 generated by the reference signal generator 310, second reference signal Ref2 generated by the reference signal generator 310, and frame start detection signal LISS_F_S generated by the frame start detector 411.

At initial start-up of the scanning system, the phase difference between the two position signals Position_L1 and Position_L2 is greater than the predetermined threshold value. The synchronization controller 314 continues to monitor for a start trigger signal from the comparator circuit 322 indicating that the phase difference is less than the predetermined threshold value. When the phase difference becomes less than the predetermined threshold value, the synchronization controller 314 triggers a start of the first and the second reference signals Ref1 and Ref2. Specifically, the synchronization controller 314 synchronously triggers a first transition edge of the first reference signal Ref1 and a second transition edge of the second reference signal Ref2 when the comparison result provided by the comparator circuit 322 indicates that the phase difference is less than the predetermined threshold value. The first transition edge and the second transition edge are either a rising transition edge or a falling transition edge. The first transition edge and the second transition edge are synchronously triggered such that the first reference signal Ref1 and the second reference signal Ref2 start in-phase (i.e., with zero phase difference).

In addition, the frame start detector 411 triggers a LISS_F_S pulse when the phase difference becomes less than the predetermined threshold value. The LISS_F_S pulse is synchronously triggered with the first and the second transition edges of the two reference signals Ref1 and Ref2. Thus, the start of a first Lissajous frame, indicated by the LISS_F_S pulse, is synchronous with the start of the two reference signals Ref1 and Ref2.

Figure 6:
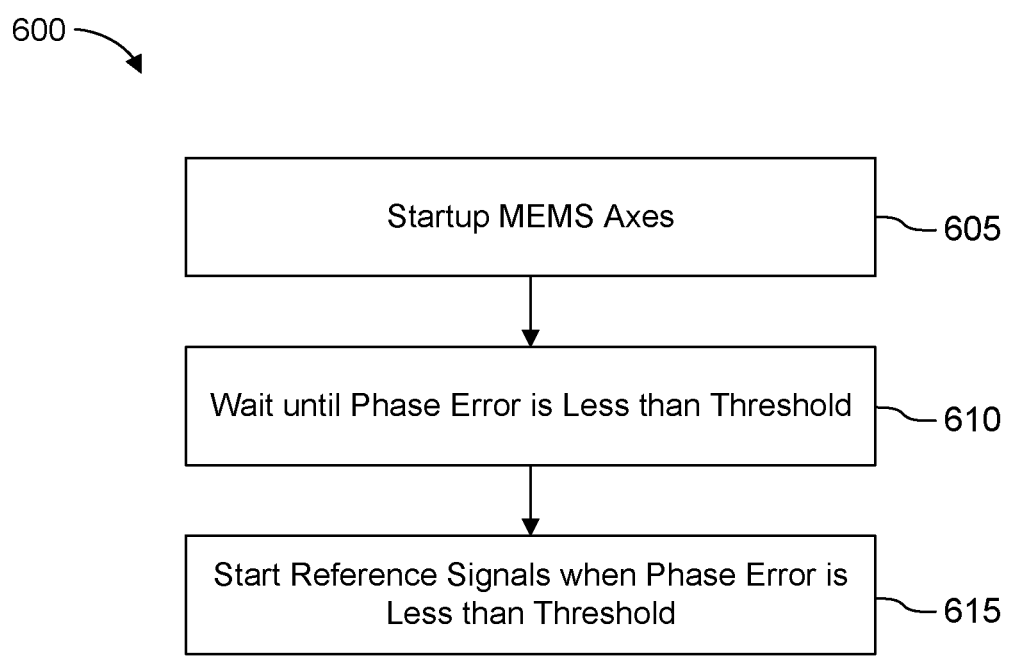
FIG. 6 illustrates a method of performing a Lissajous lock during a start-up operation of a scanning system according to one or more embodiments.

FIG. 6 illustrates a method 600 of performing a Lissajous lock during a start-up operation of a scanning system according to one or more embodiments. The method 600 includes starting up the oscillations of both scanning axes (operation 605), monitor for a phase condition of the two position signals Position_L1 and Position_L2 to be satisfied (operation 610), and start the two reference signals Ref1 and Ref2 when the phase condition is satisfied (operation 615).

Using the disclosed synchronization approaches results in achieve a faster Lissajous lock at start-up of the scanning system. As a result, the time required until the scanner is ready for shooting the light beam is reduced significantly.

Although embodiments described herein relate to a MEMS device with a mirror, it is to be understood that other implementations may include optical devices other than MEMS mirror devices or other MEMS oscillating structures. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor" or "processing circuitry" as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A controller including hardware may also perform one or more of the techniques described in this disclosure. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes the controller, via a computer program, to perform the steps of a method.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. An oscillator system, comprising:
an oscillator structure configured to oscillate about a first axis according to a first oscillation and oscillate about a second axis according to a second oscillation;
a first driver configured to generate a first drive signal to drive the first oscillation of the oscillator structure, monitor a first angular trajectory of the oscillator structure about the first axis, and generate a first position signal that indicates a position of the oscillator structure about the first axis based on the first angular trajectory;

a second driver configured to generate a second drive signal to drive the second oscillation of the oscillator structure, monitor a second angular trajectory of the oscillator structure about the second axis, and generate a second position signal that indicates a position of the oscillator structure about the second axis based on the second angular trajectory;

a phase error detector configured to determine a phase difference between the first position signal and the second position signal;

a comparator circuit configured to compare the phase difference to a threshold value and generate a comparison result;

a reference signal generator configured to generate a reference signal having a first frequency;

a synchronization circuit configured to synchronize the first oscillation to the first frequency according to the reference signal; and a synchronization controller configured to monitor the comparison result and trigger a start of the reference signal in response to the comparison result indicating that the phase difference is less than the threshold value.

2. The oscillator system of claim 1, wherein:

the first driver is configured to detect first zero-crossing events of the oscillator structure at which an oscillation angle of the oscillator structure about the first axis is detected to be at zero, and generate the first position signal that indicates each of the detected first zero-crossing events with a first pulse transition or a second pulse transition, and the second driver is configured to detect second zero-crossing events of the oscillator structure at which an oscillation angle of the oscillator structure about the second axis is detected to be at zero, and generate the second position signal that indicates each of the detected second zero-crossing events with a third pulse transition or a fourth pulse transition.

3. The oscillator system of claim 1, wherein, following the start of the reference signal, the first driver is configured to regulate the first drive signal to drive the first oscillation at the first frequency.

4. The oscillator system of claim 3, wherein:

the synchronization circuit is configured to receive the first position signal and the reference signal, and generate a first synchronization control signal based on a difference between the first position signal and the reference signal, and the first driver is configured to receive the first synchronization control signal and regulate the first drive signal to drive the first oscillation at the first frequency based on the first synchronization control signal.

5. The oscillator system of claim 1, wherein the synchronization circuit is configured to control the first driver to generate the first drive signal based on a frequency control, and control the second driver to generate the second drive signal based on at least one of an amplitude control or phase control.

6. The oscillator system of claim 1, wherein the synchronization circuit is configured to control the first driver based on frequency synchronization control, and control the second driver based on at least one of amplitude synchronization control or phase synchronization control.

7. The oscillator system of claim 1, wherein the second driver is configured to drive the second oscillation at a second frequency, and wherein the first frequency and the second frequency are different and have a fixed frequency ratio.

8. The oscillator system of claim 1, wherein the synchronization controller is configured to trigger a start of a Lissajous frame in response to the comparison result indicating that the phase difference is less than the threshold value.

9. The oscillator system of claim 8, wherein the start of the Lissajous frame is synchronous with the start of the reference signal.

10. The oscillator system of claim 1, wherein the reference signal generator comprises:

a common clock source configured to generate a common clock signal;

a divider configured to divide the common clock signal by an integer to generate a reference clock signal having the first frequency; and a counter configured to trigger signal pulses of the reference signal according to the reference clock signal, wherein the synchronization controller is configured to synchronously initialize or reset the counter in response to the comparison result indicating that the phase difference is less than the threshold value in order to trigger the start of the reference signal.

11. The oscillator system of claim 1, further comprising:

a frame start detector configured to generate a frame start detection signal in response to the comparison result indicating that the phase difference is less than the threshold value, wherein the frame start detection signal is triggered synchronously with the start of the reference signal.

12. The oscillator system of claim 1, further comprising:

a Lissajous lock detector configured to evaluate the phase difference between the first position signal and the second position signal, and generate a Lissajous lock signal in response to the comparison result indicating that the phase difference is less than the threshold value.

13. The oscillator system of claim 1, wherein the synchronization controller is configured to monitor the comparison result during a start-up phase of the oscillator system, wherein an end of the start-up phase is demarked by a first instance the comparison result indicates that the phase difference is less than the threshold value, and wherein a monitoring of the comparison result is disabled at the end of the start-up phase.

14. An oscillator system, comprising:

a first oscillator structure configured to oscillate about a first axis according to a first oscillation;

a second oscillator structure configured to oscillate about a second axis according to a second oscillation;

a first driver configured to generate a first drive signal to drive the first oscillation of the first oscillator structure, monitor a first angular trajectory of the first oscillator structure about the first axis, and generate a first position signal that indicates a position of the first oscillator structure about the first axis based on the first angular trajectory;

a second driver configured to generate a second drive signal to drive the second oscillation of the second oscillator structure, monitor a second angular trajectory of the second oscillator structure about the second axis, and generate a second position signal that indicates a position of the second oscillator structure about the second axis based on the second angular trajectory;

a phase error detector configured to determine a phase difference between the first position signal and the second position signal;

a comparator circuit configured to compare the phase difference to a threshold value and generate a comparison result;

a reference signal generator configured to generate a reference signal having a first frequency;

a synchronization circuit configured to synchronize the first oscillation to the first frequency according to the reference signal; and a synchronization controller configured to monitor the comparison result and trigger a start of the reference signal in response to the comparison result indicating that the phase difference is less than the threshold value.

15. The oscillator system of claim 14, wherein, following the start of the reference signal, the first driver is configured to regulate the first drive signal to drive the first oscillation at the first frequency.

16. The oscillator system of claim 15, wherein:

the synchronization circuit is configured to receive the first position signal and the reference signal, and generate a first synchronization control signal based on a difference between the first position signal and the reference signal, and the first driver is configured to receive the first synchronization control signal and regulate the first drive signal to drive the first oscillation at the first frequency based on the first synchronization control signal.

17. The oscillator system of claim 14, wherein the synchronization circuit is configured to control the first driver to generate the first drive signal based on a frequency control, and control the second driver to generate the second drive signal based on at least one of an amplitude control or phase control.

18. The oscillator system of claim 14, wherein the synchronization circuit is configured to control the first driver based on frequency synchronization control, and control the second driver based on at least one of amplitude synchronization control or phase synchronization control.

19. The oscillator system of claim 14, wherein the second driver is configured to drive the second oscillation at a second frequency, and wherein the first frequency and the second frequency are different and have a fixed frequency ratio.

20. A method of synchronizing a first oscillation about a first axis with a second oscillation about a second axis, the method comprising:

monitoring a first angular trajectory of the first oscillation about the first axis;

monitoring a second angular trajectory of the second oscillation about the second axis;

generating a first position signal that indicates a position of the first oscillation about the first axis based on the first angular trajectory;

generating a second position signal that indicates a position of the second oscillation about the first axis based on the second angular trajectory;

determining a phase difference between the first position signal and the second position signal;

comparing the phase difference to a threshold value to generate a comparison result;

generating a reference signal having a first frequency;

synchronizing the first oscillation to the first frequency according to the reference signal;

monitoring the comparison result; and triggering a start of the reference signal in response to the comparison result indicating that the phase difference is less than the threshold value.

* * * * *